(12) United States Patent
Jackson

(10) Patent No.: US 11,719,750 B2
(45) Date of Patent: Aug. 8, 2023

(54) MEASUREMENT UNCERTAINTY AND MEASUREMENT DECISION RISK ANALYSIS TOOL AND RELATED METHODS

(71) Applicant: The United States of America, as represented by the Secretary of the Navy, Crane, IN (US)

(72) Inventor: Dennis H Jackson, Riverside, CA (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 17/145,985

(22) Filed: Jan. 11, 2021

(65) Prior Publication Data

US 2021/0215758 A1    Jul. 15, 2021

Related U.S. Application Data

(60) Provisional application No. 62/958,937, filed on Jan. 9, 2020.

(51) Int. Cl.
   *G01R 31/317*     (2006.01)
(52) U.S. Cl.
   CPC .............................. *G01R 31/31718* (2013.01)
(58) Field of Classification Search
   CPC .................................................. G01R 31/31718
   See application file for complete search history.

(56) References Cited

PUBLICATIONS

Macii, David, "Management of Measurement Uncertainty for Effective Statistical Process Control", Oct. 2003, IEEE Transactions on Instrumentation and Measurement, vol. 52, No. 5., pp. 1611-1617.*
Drenzner, Zvi, Wesolowsky, G.O.; On the Computation of the Bivariate Normal Integral, 1990, Journal of Statistical Computation and Simulation, vol. 35; pp. 101-108, Gordon and Breach, Science Publish, Inc., Philadelphia, Pennsylvania, Printed the United Kingdom.
Genz, Alan, Numerical Computation of Rectangular Bivariate and Trivariate Normal and t Probabilities, Statistics and Computing, vol. 14, 2004, pp. 251-260, Kluwer Academic Publishers, Headquarters—Amsterdam, Netherlands.
West, Graeme, Better Approximations To Cumulative Normal Functions, Wilmott Magazine, 9:70-76, May 2005, pp. 1-11.
Hogg, Robert V., Craig, Allen T., Introduction to Mathematical Statistics, 3rd Ed., 1970, pages of book provided include cover image, cover page, copyright page and pp. 29, 106, and 111, Macmillan Publishing Co., Inc,, New York.
ANSI/NCSL Z540.Mar. 2006, American National Standard for Calibration—Requirements for the Calibration of Measuring and Test Equipment, Aug. 2006, NCSL International Publication.

(Continued)

*Primary Examiner* — Manuel L Barbee
(74) *Attorney, Agent, or Firm* — Naval Surface Warfare Center, Crane Division

(57) ABSTRACT

The present invention relates to a system and method for calculating measurement uncertainty and determining measurement decision risk. Measurement uncertainty is calculated based on a plurality of error contributors. Measurement decision risk is evaluated using the measurement uncertainty, and mitigation strategies are applied to lower the probability of false acceptance and the probability of false rejection.

2 Claims, 3 Drawing Sheets

False Accept Event

(56) References Cited

PUBLICATIONS

ANSI/NCSL Z540-Feb. 1997, American National Standard for Expressing Uncertainty—U.S. Guide to the Expression of Uncertainty in Measurement, Oct. 1997, NCSLPublication.
Opnavinst 3960.16B, Navy Test, Measurement, and Diagnostic Equipment, Automatic Test Systems, and Metrology and Calibration, Nov. 2017, U.S. Navy Publication.

* cited by examiner

|  | TMDE Measure | TMDE Stimulus |
|---|---|---|
| UUT Measure | UUT & TMDE measure a common stimulus (3) | UUT measures TMDE stimulus (1) |
| UUT Stimulus | UUT stimulus measured by TMDE (2) | UUT & TMDE stimuli are measured by a comparator (4) |

*FIG. 1*

Uncertainty Budget

| | Error Sources (Description) | Error Limit (or Std Unc) | Error Limit Distribution (or Std Uncertainty) | Uncertainty Type (A/B) | Degrees of Freedom | Standard Uncertainty |
|---|---|---|---|---|---|---|
| 1 | TMDE | 0.01 | Rectangular | B | | 0.005773503 |
| 2 | Resolution | 0.0001 | Rectangular (Resolution) | B | | 2.88675E-05 |
| 3 | Repeatability | 0.0001 | Rectangular (Resolution) | B | | 2.88675E-05 |
| 4 | TMDE Calibrator | 0.001 | Rectangular | B | | 0.00057735 |
| 5 | | | | | | |

Measurement Equation (Additive)

Voltage = True + e(TMDE) + e(Resolution) + e(Repeatability) + e(TMDE Calibrator)

Combined Uncertainty Results

| | | |
|---|---|---|
| Combined Uncertainty | 0.005802442 | Combined Uncertainty 0.005802442 |
| Uncertainty Confidence | 95.00% | |
| Effective Degrees of freedom | | ☑ Use Degree of Freedom? |
| Coverage Factor (k) | 1.960 | |
| Expanded Uncertainty | 0.011372577 | |

Test Uncertainty Budget

*FIG. 4*

MEASUREMENT UNCERTAINTY AND MEASUREMENT DECISION RISK ANALYSIS TOOL AND RELATED METHODS

CROSS-REFERENCE TO RELATED APPLICATIONS

The present application claims priority to U.S. Provisional Patent Application Ser. No. 62/958,937, filed Jan. 9, 2020, entitled "AUTOMATION OF MEASUREMENT UNCERTAINTY AND MEASURE DECISION RISK ANALYSIS5," the disclosure of which is expressly incorporated by reference herein.

STATEMENT REGARDING FEDERALLY SPONSORED RESEARCH OR DEVELOPMENT

The invention described herein includes contributions by one or more employees of the Department of the Navy made in performance of official duties and may be manufactured, used and licensed by or for the United States Government for any governmental purpose without payment of any royalties thereon. This invention (Navy Case 200,633) is assigned to the United States Government and is available for licensing for commercial purposes. Licensing and technical inquiries may be directed to the Technology Transfer Office, Naval Surface Warfare Center Corona Division, email: CRNA_CTO@navy.mil.

FIELD OF THE INVENTION

The present invention related to calculating measurement uncertainty and determining measurement decision risk.

BACKGROUND AND SUMMARY OF THE INVENTION

The present invention relates to a system and method for calculating measurement uncertainty and determining measurement decision risk. The underlying objective of tolerance testing is to make good test decisions. Since tolerance testing is performed using Test, Measurement, and Diagnostic Equipment (TMDE) that have uncertainty, there is a chance that a tolerance test will result in a wrong decision. The probability of a wrong decision is called measurement decision risk, and this risk is a key characteristic of tolerance testing policy. There are two major types of wrong decisions that can be made during a tolerance test, or as the result of a tolerance test: False Acceptance, wherein the tolerance test finds the Unit Under Test (UUT) to be in-tolerance, when it is really out of tolerance. False Rejection, wherein the tolerance test finds the UUT to be out of tolerance, when it is really in-tolerance. Historically, measurement decision risk has been managed using the Test Accuracy Ratio (TAR), which is loosely defined as the ratio of the UUT specification to the TMDE specification. A TAR of 4:1 was generally considered acceptable. Unfortunately, when a 4:1 TAR could not be achieved, there was no alternative that could mitigate the problem. Measurement decision risk is managed by calculating the probabilities of the two wrong decisions: the Probability of False Acceptance (PFA) and the Probability of False Rejection (PFR).

According to an illustrative embodiment of the present disclosure, measurement uncertainty is calculated based on a plurality of error contributors. Measurement decision risk is evaluated using the measurement uncertainty, and mitigation strategies are applied to adjust the measurement uncertainty and measurement decision risk. In particular mitigation strategies will lower the PFA and PFR.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which:

FIG. 1 shows the four major testing scenarios when using a UUT and TMDE.

FIG. 4 shows an exemplary test uncertainty budget.

DETAILED DESCRIPTION OF THE DRAWINGS

Figure 2:
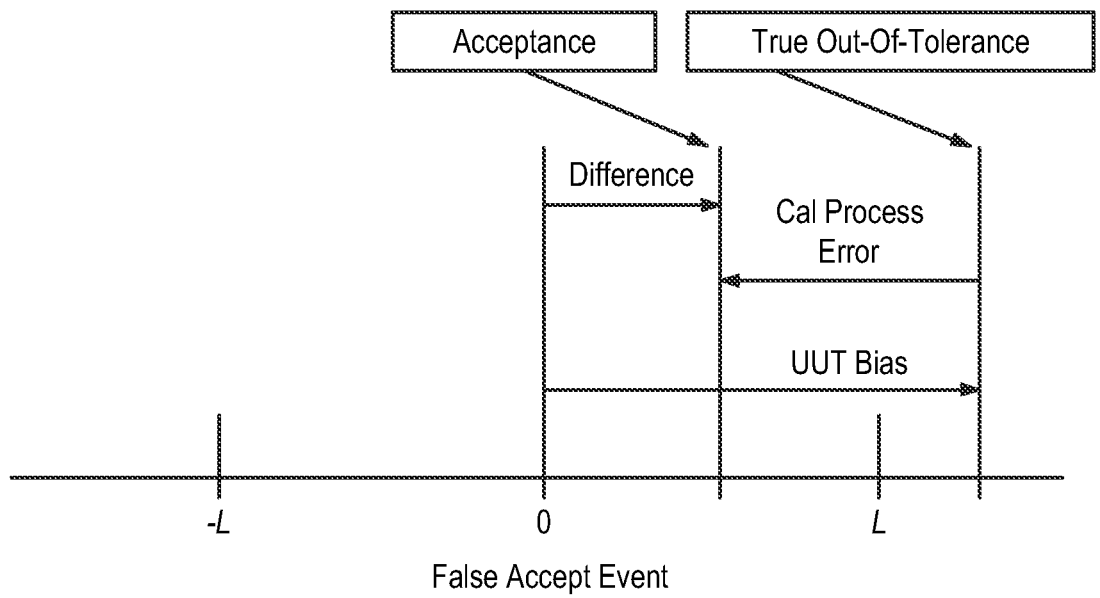
FIG. 2 shows a false accept event scenario.

The embodiments of the invention described herein are not intended to be exhaustive or to limit the invention to precise forms disclosed. Rather, the embodiments selected for description have been chosen to enable one skilled in the art to practice the invention.

FIG. 1 shows the four major testing scenarios when using a UUT and TMDE. The UUT measures the TMDE, wherein the UUT is a measurement device, such as a voltmeter, and the TMDE is a measurement source, such as a voltage source. The TMDE measures the UUT, wherein the TMDE is a measurement device, such as a voltmeter, and the UUT is a measurement source, such as a voltage source. The UUT and the TMDE both measure an external artifact, wherein both the UUT and TMDE are measuring devices, such as weight scales, and an external artifact provides a measurement source, such as a mass. The UUT and the TMDE provide artifacts which are measured using a comparator. An example of this scenario would involve the use of a balance to compare a UUT mass to a TMDE mass.

In a tolerance test, a measurement from the test is compared with specified tolerances. The treatment in this document deals with the tolerances as error rather than absolute measurement tolerances. As an example, a voltmeter that is tested at 10.0 volts to within 0.01 volts would be specified as having error tolerances of −0.01 to +0.01 volts rather than using the measurement tolerances of 9.99 volts to 10.01 volts. These error tolerances are tested using the test or calibration difference which is indicated by the variable d. A UUT is observed to be in-tolerance if this difference, d, is within tolerances. Accordingly, an observed in-tolerance event is described mathematically by:

$$L_L \leq d \leq L_U \qquad \text{Eq. 1}$$

where d is the difference between the UUT and TMDE, $L_L$ is the lower tolerance limit for the UUT, and $L_U$ is the upper tolerance limit for the UUT.

When guard bands are applied to the tolerance limits to create acceptance limits, AL and AU, the decision to accept or reject is based on the acceptance limits rather than the tolerance limits. Such acceptance limits create a difference between what is observed relative to the tolerance limits, $L_L$ and $L_U$, and what is accepted based on the acceptance limits. The mathematical definition of an acceptance is given by:

$$A_L \leq d \leq A_U \qquad \text{Eq.2}$$

where $A_L$ is the lower tolerance used to create the lower guard banded acceptance limit, and $A_U$ is the upper tolerance used to create the lower guard banded acceptance limit.

The TMDE could be a calibration standard (CALSTD) or a test instrument. It is assumed that the tolerances for the TMDE are given by $T_U$ and $T_L$. It is also assumed that the 95 percent expanded uncertainty of the calibration or test process is given by $U_{Test}$ and that the standard uncertainty of the calibration or test process is given by $u_{Test}$. The measurement reliability for this test is assumed to be R.

Measuring resolution is the smallest division or part of a division of a measurement which can be accurately read by the observer. For digital readouts, the measuring resolution refers to the last digit on the display, sometimes known as the "Least Significant Digit". For example, if a display read 15.134 volts, the measuring resolution would be 0.001 volts. In a calibration scenario, the measuring resolution would refer to the resolution of the measuring device. For tolerances that are the result of calculations, including guard bands, the measuring resolution must be applied in a manner that does not increase the range of the tolerances. For example, a measuring resolution of 0.01 applied to −0.057 to 0.057 tolerances would result in −0.05 to 0.05 tolerances. Similarly, a measuring resolution of 0.01 applied to 9.043 to 10.057 tolerances would result in 9.95 to 10.05 tolerances. Generally, it is easier to apply a measuring resolution to a plus-or-minus tolerance since that usually involves simply reducing the number of decimals. The application of measuring resolution will usually have the effect of reducing TAR and TUR (Test Uncertainty Ratio) values. In addition, guard bands with measuring resolution applied will usually provide PFA values less than the requirements.

TUR is the ratio of the span of the tolerance of a measurement quantity subject to calibration, to twice the 95% expanded uncertainty of the measurement process used for calibration, and is defined as:

$$\text{TUR} = (L_U - L_L)/(2U_{Test}) \quad \text{Eq. 3}$$

TAR is the ratio of the span of the tolerances for the UUT to the span of the tolerances of the TMDE, and is defined as:

$$\text{TAR} = |(L_U - L_L)/(T_U - T_L)| \quad \text{Eq. 4}$$

FIG. 2 shows a false accept event scenario. The objective of a tolerance test is to determine whether the bias of the UUT is in-tolerance. A tolerance is defined as the extreme allowable values of an error for an expected measurement quantity. Accordingly, the UUT is truly in-tolerance if the UUT bias is within tolerances. This true in-tolerance event can be described mathematically as:

$$L_L \leq e\text{Bias} \leq L_U \quad \text{Eq. 5}$$

A false accept event occurs when there is an acceptance (the tolerance test results in an observed in-tolerance), and a true out-of-tolerance. In this figure, the UUT bias is outside the tolerance limit, but the Test Process error causes the difference between the UUT and the TMDE to land inside the acceptance limits. Because a false acceptance represents an incorrect test decision, the probability of such events is an indicator of the quality of a test decision.

Figure 3:
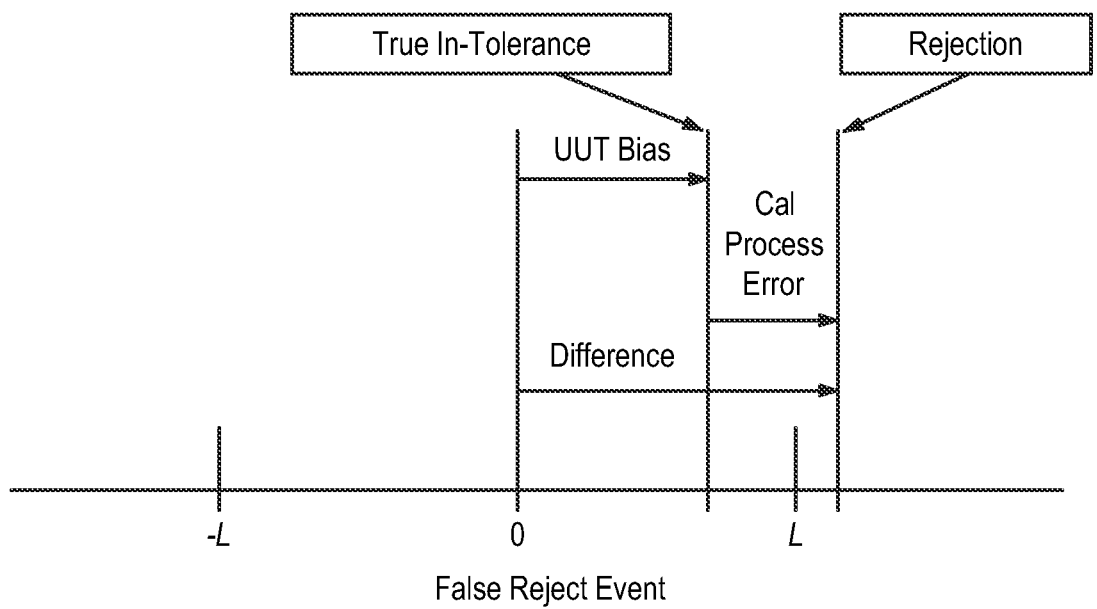
FIG. 3 shows a false reject event scenario.

FIG. 3 shows a false reject event scenario. The probability of false reject is also used in discussing and managing measurement decision risk. A rejection occurs when the test difference, d, is observed to be outside the tolerance limits. The false rejection event occurs when there is a rejection (the tolerance test results in an observed out-of-tolerance), and a true in-tolerance. In this figure, the UUT bias is inside the acceptance limits but the test process error causes the difference between the observed measurement difference between the UUT and TMDE to lie outside the tolerance limits.

FIG. 4 shows an exemplary test uncertainty budget. The uncertainty budget is a key report used for calculating measurement uncertainty. Using this tool, the relevant contributors to measurement error are described and characterized using a statistical concept known as the standard uncertainty. The final result of uncertainty budget is a measurement uncertainty that takes into account all of the error contributors. Measurement uncertainty is generally assessed to determine if a measurement is accurate enough for a given application. When used in conjunction with such calculations as the Probability of False Acceptance (PFA) and the Test Uncertainty Ratio (TUR), the uncertainty tells you whether a measurement should be used to make calibration or maintenance actions or decisions. There are various types of measurement errors that contribute to the overall measurement error. The broad classifications of measurement error contributors or sources include: (1) calibration error, which is the portion of the error due to the measurement process used in calibration; (2) repeatability error, which is the portion of the error due to measurement to measurement variability within a given measurement session; (3) resolution error, which is the portion of the error due to readability; (4) environment error, which is the portion of the error due to environmental effects; and (5) other errors, which is the portion of the error due to shocks and changes to an instrument over time (e.g., drift). Multiple sources of uncertainty can be combined using the Root Sum of Squares (RSS) method, wherein you sum the square of each uncertainty, then take the square root of that sum.

The calculation of measurement decision risk may involve using mitigation strategies including guard bands and calibration intervals to achieve measurement decision risk requirements. The use of mitigation strategies changes the mathematical assumptions necessary for making these risk calculations. For example, using guard bands according to the present disclosure includes changing or tightening acceptance limits can in such a way as to meet test decision risk requirements. In a further example, using a mitigation strategy to improve risk values with calibration intervals includes a decreased calibration interval that will increase the measurement reliability that may allow test decision risk requirements to be met. The process begins with a baseline analysis of a test point to determine risk results. Both the baseline and subsequent analyses vary depending on the source of the measurement reliability. If the mitigation process is being applied to an in-service UUT with measurement reliability based on test results, baseline assumption methods discussed are used to estimate the risk values. If the mitigation process is being applied to a new UUT with measurement reliability assumed based an assumed (or required) TUR, changes to the baseline methods are used to estimate the risk values.

The assessment of a tolerance test for a UUT begins with the determination of the test tolerances and the test uncertainty. In addition, an end of period measurement reliability is assumed. For in-service UUT, this measurement reliability is based on the analysis of test results. The assumptions for the tolerance test are as follows: $L_{U,A}$ is the assumed upper tolerance limit for the UUT; $L_{L,A}$ is the assumed lower tolerance limit for the UUT; $U_{Test,A}$ is the assumed 95% expanded uncertainty of the test based on the TMDE and the test process; $R_A$ is the assumed measurement reliability or probability of in-tolerance (end of period) calculated using calibration results. Based on the assumed expanded test uncertainty (95%), the assumed TUR is given by:

$$\text{TUR}_A = (L_{U,A} - L_{L,A})/(2U_{Test,A}) \quad \text{Eq. 6}$$

The assumed standard uncertainty of the test is then given by:

$$u_{Test,A} = U_{Test,A}/Z_{0.95} \qquad \text{Eq. 7}$$

where $Z_{0.95}$ is the Standard Normal Distribution percentile appropriate for 95% confidence or approximately 1.96.

The assumed uncertainty of the bias of the UUT is obtained using the function UBIAS( ) that will be derived as:

$$u_{Bias,A} = UBIAS(R_A, u_{Test,A}, L_{L,A}, L_{U,A}) \qquad \text{Eq. 8}$$

The baseline results are obtained assuming that the end of period reliability was realized with calibrations using the assumed (calculated) TUR. For a new UUT, the assumed end of period reliability would be predicted if the assumed TUR was used for calibrations. For example, if a 4:1 TUR was used in calibration, an 85% reliability would be obtained. Quite often, a lower TUR, $TUR_C$, is used because of limitations in TMDE capability. The changes to the TUR will result in changes to the reliability and the risks. If $TUR_C$ is smaller than $TUR_A$, the reliability will be lower and the risks will be higher. The inputs necessary to calculate risk and reliability will be described using the C (Changed) subscript rather than the A (Assumed) subscript. It should be noted here that some of the inputs with the C subscript will take the same value as the assumed inputs. The changes to the tolerance test are as follows. The tolerances remain the same as the assumed tolerances, so $L_{L,C} = L_{L,A}$ and $L_{U,C} = L_{U,A}$. The changed value of the TUR, $TUR_C$, gives a changed value of the standard test uncertainty given by $u_{Test,C} = U_{Test,C}/Z_{0.95}$, where $U_{Test,C} = (L_{U,C} - L_{L,C})/(2 TUR_C)$. The uncertainty of the test changes while the uncertainty of the bias of the UUT does not. Using the function UBIAS( ) the changed reliability is given by:

$$R_C = F(L_{U,C}/u_{d,C}) - F(L_{L,C}/u_{d,C}) \qquad \text{Eq. 9}$$

where $F(x)$ is the Standard Normal distribution function.

As mentioned above, the calculation of measurement decision risk when using mitigation strategies may include guard bands and calibration intervals to achieve measurement decision risk requirements. Guard bands provide acceptance limits that are tighter than the tolerance limits. This has the effect of reducing PFA while increasing PFR. The acceptance limits are given by: AL=The lower tolerance used to create the lower guard banded acceptance limit, and AU=The upper tolerance used to create the upper guard banded acceptance limit. Guard band calculation is not based on a simple formula, but rather a numerical search algorithm that finds the guard bands that provide a required PFA value.

A shortened calibration interval has the effect of increasing the reliability and making the uncertainty of the bias of the UUT smaller. This has the effect of reducing both PFA and PFR. The tolerances remain the same as the assumed tolerances, and the TUR and the test uncertainties remain the same as the assumed ones. Assuming the exponential model for the measurement reliability, the assumed reliability is given as a function of the assumed interval by:

$$R_A = \exp(-kI_A) \qquad \text{Eq. 10}$$

where k is the failure rate and $I_A$ is the assumed interval. An intermediate changed reliability for the changed interval is then predicted by:

$$R_B = \exp((\ln(R_A)/I_A) \cdot I_C) = F(L_{U,C}/u_{d,C}) - F(L_{L,C}/u_{d,C}) \qquad \text{Eq. 11}$$

Multiple mitigation strategies can be used simultaneously. In addition, there can be multiple changes to the baseline scenario. The inputs necessary to calculate risk and reliability will be described using the C (Changed) subscript rather than the A (Assumed) subscript. It should be noted here that some of the inputs with the C subscript will take the same value as the assumed inputs. Changes to the TUR can occur either because of changes to the uncertainty of the test (changes to the TMIDE) or by changes to the UUT tolerances. If there are changes to the UUT tolerances, these can dramatically change the reliability. If the tolerances are changed, $L_{L,C}$ is the changed lower tolerance limit for the UUT and $L_{U,C}$ is the changed upper tolerance limit for the UUT. If the UUT tolerances are not changed, $L_{L,C} = L_{L,A}$ and $L_{U,C} = L_{U,A}$. Changes to the uncertainty of the test generally occur because of changes to the tolerances for the TMDE. If the expanded uncertainty of the test changes, $U_{Test,C}$ is the changed expanded uncertainty of the test. If the expanded uncertainty is not changed, $U_{Test,C} = U_{Test,A}$.

Based on these initial changes, the changed standard uncertainty of the test and the changed TUR will be given by:

$$TUR_C = (L_{U,C} - L_{L,C})/(2 U_{Test,C}) \qquad \text{Eq. 12}$$

The assumed standard uncertainty of the test is then given by:

$$u_{Test,C} = U_{Test,C}/Z_{0.95} \qquad \text{Eq. 13}$$

If guard bands are applied, $A_L$ is the lower guard banded acceptance limit for the UUT and $A_U$ is the upper guard banded acceptance limit for the UUT. If guard bands are not applied $A_L = L_{L,C}$ and $A_U = L_{U,C}$. the changed reliability is given by:

$$R_C = F(A_U/u_{d,C}) - F(A_L/u_{d,C}) \qquad \text{Eq. 14}$$

where $F(x)$ is the Standard Normal distribution function.

It is noted that the Probability of False Acceptance (PFA) is the probability of making an acceptance decision when the UUT is observed and reported to be in-tolerance but is actually out-of-tolerance. The PFA is given mathematically by:

$$PFA = Pr([\text{Observed In-Tolerance}] \text{ AND } [\text{True Out-Of-Tolerance}]) = Pr([x \leq L_U] \text{ AND } [y > L_U]), \qquad \text{Eq. 14}$$

where x is the TMDE measurement of output by the UUT and y is the true value output by the UUT. Further, the Probability of False Rejection (PFR) is the probability of making a rejection decision when the UUT is observed and reported to be out-of-tolerance but is actually in-tolerance. The PFR is given mathematically by:

$$PFR = Pr([\text{Observed Out-Of-Tolerance}] \text{ AND } [\text{True In-Tolerance}]) = Pr([x > L_U] \text{ AND } [y \leq L_U]), \qquad \text{Eq. 15}$$

Still further, the methods described above may be implemented by a computer or processor that execute computer instructions or code on a non-transitory computer-readable medium for effecting the above-described methods and functionalities.

Although the invention has been described in detail with reference to certain preferred embodiments, variations and modifications exist within the spirit and scope of the invention as described and defined in the following claims.

The invention claimed is:

1. A method of determining measurement decision risk for improved tolerance testing, the method comprising:
providing at least one unit under test (UUT) and at least one test, measurement, and diagnostic equipment (TMDE);
determining at least one error source including one or more of calibration error, repeatability error due to measurement to measurement variability, resolution error due to readability, environment error due to environmental effects, or error due to shocks and/or changes to the at least one UUT or at least one TMDE, wherein each error source has an associated uncertainty value;

determining a first combined uncertainty value of the at least one error source;

determining a first probability of false acceptance (PFA) and a first probability of false rejection (PFR) using the first combined uncertainty value;

comparing the first PFA and first PFR to a predetermined threshold value;

applying at least one mitigation strategy to the first combined uncertainty to create a second combined uncertainty value, wherein the at least one mitigation strategy includes one or more of utilizing guard bands or calibration intervals such that the utilization of the guard bands includes changing acceptance limits of the bands to meet test decision risk requirements and the utilization of calibration intervals includes changing a calibration interval to decrease the calibration interval to effect an increase in measurement reliability to allow the test decision risk requirements to be met;

determining a second PFA and a second PFR using the second combined uncertainty value; and using the second combined uncertainty value for tolerance testing of at least one of the at least one UUT or the at least one TDME.

2. A non-transitory computer readable medium including instructions for causing a computer to implement a method for determining measurement decision risk for improved tolerance testing for at least one unit under test (UUT) and at least one test, measurement, and diagnostic equipment (TMDE), the method comprising:

determining at least one error source including one or more of calibration error, repeatability error due to measurement to measurement variability, resolution error due to readability, environment error due to environmental effects, or error due to shocks and/or changes to the at least one UUT or at least one TMDE, wherein each error source has an associated uncertainty value;

determining a first combined uncertainty value of the at least one error source;

determining a first probability of false acceptance (PFA) and a first probability of false rejection (PFR) using the first combined uncertainty value;

comparing the first PFA and first PFR to a predetermined threshold value;

applying at least one mitigation strategy to the first combined uncertainty to create a second combined uncertainty value, wherein the at least one mitigation strategy includes one or more of utilizing guard bands or calibration intervals such that the utilization of the guard bands includes changing acceptance limits of the bands to meet test decision risk requirements and the utilization of calibration intervals includes changing a calibration interval to decrease the calibration interval to effect an increase in measurement reliability to allow the test decision risk requirements to be met;

determining a second PFA and a second PFR using the second combined uncertainty value; and using the second combined uncertainty value for tolerance testing of at least one of the at least one UUT or the at least one TDME.

\* \* \* \* \*